United States Patent [19]

Kimura

[11] Patent Number: 5,378,650

[45] Date of Patent: Jan. 3, 1995

[54] SEMICONDUCTOR DEVICE AND A MANUFACTURING METHOD THEREOF

[75] Inventor: Hiroshi Kimura, Hyogo, Japan

[73] Assignee: Mitsubishi Denki Kabushiki Kaisha, Tokyo, Japan

[21] Appl. No.: 6,394

[22] Filed: Jan. 21, 1993

Related U.S. Application Data

[62] Division of Ser. No. 777,711, Oct. 21, 1991, abandoned.

[30] Foreign Application Priority Data

Oct. 22, 1990 [JP] Japan .................................. 2-274360

[51] Int. Cl.⁶ ............................................ H01L 21/76
[52] U.S. Cl. ......................................... 437/63; 437/70; 437/26; 437/28; 437/984
[58] Field of Search ...................... 437/63, 70, 26, 28, 437/984

[56] References Cited

U.S. PATENT DOCUMENTS

| | | |
|---|---|---|
| 3,387,286 | 6/1968 | Dennard et al. . |
| 4,282,539 | 8/1981 | Schrader . |
| 4,494,304 | 1/1985 | Yoshioka . |
| 4,514,233 | 4/1985 | Kawabuchi . |
| 4,560,421 | 12/1985 | Maeda et al. ........................ 437/28 |
| 4,644,386 | 2/1987 | Nishizawa et al. . |
| 4,682,408 | 7/1987 | Takebayashi . |
| 4,702,000 | 10/1987 | Matlock et al. . |
| 4,829,019 | 5/1989 | Mitchell et al. ...................... 437/70 |
| 4,873,559 | 10/1989 | Shimizu et al. . |
| 5,004,701 | 4/1991 | Motokawa ............................ 437/69 |
| 5,023,680 | 6/1991 | Gill et al. . |

FOREIGN PATENT DOCUMENTS

| | | | |
|---|---|---|---|
| 0317257A2 | 5/1989 | European Pat. Off. . | |
| 0129591 | 11/1978 | Japan .................................... | 437/70 |
| 0196543 | 12/1982 | Japan .................................... | 437/69 |
| 0144543 | 6/1988 | Japan .................................... | 437/69 |

OTHER PUBLICATIONS

IBM Technical Disclosure Bulletin; vol. 16, No. 3—Aug. 1973 One-Device Storage Cell Method; A. R. LeBlanc; pp. 956 and 957.

IBM Technical Disclosure Bulletin; vol. 27, No. 3—Aug. 1984; "Sidewall-Defined Self-Aligned Reach-Up Isolation"; W. Wang; 2 sheets.

*Primary Examiner*—Brian E. Hearn
*Assistant Examiner*—Trung Dang
*Attorney, Agent, or Firm*—Lowe, Price, LeBlanc & Becker

[57] ABSTRACT

A semiconductor device includes a semiconductor substrate having a main surface, an isolating insulator film formed on the main surface and having a substantially vertical side wall, a plurality of semiconductor element regions, which are separated from each other by the isolating insulator film, for forming semiconductor circuit elements therein, a first impurity region formed in the substrate to a predetermined depth from an interface between the isolating insulator film and the substrate by ion implantation, second impurity regions formed in the element regions simultaneously with the first impurity region by the ion implantation and located at a predetermined depth from the main surface, and a side wall insulator film formed by anisotropic etching on the vertical wall of the isolating insulator film.

20 Claims, 9 Drawing Sheets

SEMICONDUCTOR DEVICE AND A MANUFACTURING METHOD THEREOF

This application is a division of application Ser. No. 07/777,711; filed Oct. 21, 1991, now abandoned.

BACKGROUND OF THE INVENTION

1. Field of the Invention

The present invention relates to a semiconductor device, and particularly to improvements of an isolating region between semiconductor circuit elements and a formation method of same.

2. Description of the Background Art

FIGS. 3A–3F are cross sections illustrating processes for forming an isolating region, using conventional selective oxidation.

Referring to FIG. 3A, a $SiO_2$ film 22 having a thickness of about 500 Å is formed on a silicon substrate 21 by thermal oxidation. The $SiO_2$ film 22 is covered with a $Si_3N_4$ film 23 deposited to have a thickness of about 3000 Å by CVD (chemical vapor deposition).

Referring to FIG. 3B, a resist layer is formed on the $Si_3N_4$ film 23. This resist layer is patterned to form a resist pattern 24.

Referring to FIG. 3C, the $Si_3N_4$ film 23 is etched, using the resist pattern 24 as a mask, to form a $Si_3N_4$ pattern 23a. Thereafter, the $Si_3N_4$ film pattern 23 and the resist pattern 24 are used as the mask for effecting ion irradiation, as shown by arrows 25, to form an impurity region 26 in a surface layer of the silicon substrate 21. In this process, if the substrate 21 is of a p$^-$ conductive type, boron ions are usually injected at a dose rate of $1 \times 10^{13} cm^{-2}$ in an acceleration voltage ranging from 20 to 30 keV.

Referring to FIG. 3D, the resist pattern 24 has been removed.

Referring to FIG. 3E, the silicon substrate 21 is selectively oxidized thermally, using the $Si_3N_4$ film pattern 23a as the mask to form a field oxide film 22a having a thickness of about 5000 Å. In this process, oxygen is also laterally supplied by diffusion from an end of an opening in the $Si_3N_4$ film 23a, so that a bird's beak 22b which laterally extends about 0.3–0.5 μm from the field oxide film 22a is formed. During the selective oxidation, the impurity region 26 diffuses not only in a direction of depth but also in a lateral direction as shown by arrows 27 to form a channel stopper 26a laterally extending about 0.2 μm beyond an edge of the bird's beak 22b.

In order to prevent activation of a parasitic MOS (metal oxide semiconductor transistor) during formation of a conductive line (not shown) on the field oxide film 22a, it is preferable for the field oxide film 22a to have a thickness as large as possible. However, the thick field oxide film 22a will increase the width of the bird's beak 22b. Therefore, in a semiconductor IC having the supply voltage of 5V, the field oxide film 22a is usually formed to have a thickness of about 5000 Å so as to prevent the excessive extension of the bird's beak 22b and to set a threshold voltage of the parasitic MOS at a value of 10V or more.

Referring to FIG. 3F, the $Si_3N_4$ film pattern 23a has been removed. Thereafter, ions are injected, as show by arrows 28, using the field oxide films 22a and 22b as the mask for forming source/drain regions 29 of, for example, the FET (field effect transistor). In this operation, the channel stopper 26a has been laterally extended beyond the edge of the bird's beak 22b and thus into the source/drain regions 29.

In order to prevent the activation of the parasitic MOS transistor, a high impurity concentration in the channel stopper 26a is preferable. However, an excessively high impurity concentration in the channel stopper 26a will reduce a junction breakdown voltage of the source/drain regions 29 contacting the channel stopper 26a. Therefore, the boron ion 25 is injected at the dose rate of about $1 \times 10^{13} cm^{-2}$, as already described with reference to FIG. 3C.

Referring to FIG. 4A, there is illustrated a top view of an example of a memory cell array which includes the field oxide film formed by means of the selective oxidation. At an upper half in this FIG. 4A, bit lines BL are net illustrated, for simplicity reasons. FIG. 4C shows an enlarged sectional view taken along a line 4C—4C in FIG. 4A.

As seen from FIGS. 4A and 4C, each elongated semiconductor circuit element region 30 is provided with three source/drain regions 9 aligned in a lengthwise direction thereof. The three source/drain regions 9 form a pair of FETs and the middle source/drain region 9 is commonly used by these two FETs and is connected to the bit line BL through a contact hole 31. Each FET is selectively turned on and turned off by a corresponding word line WL.

In the semiconductor element regions 30 surrounded by the field oxide film 22a, the bird's beaks 22b having widths of about 0.3 μm are extended along the periphery thereof, respectively, and thus effective widths of the semiconductor element region 30 are reduced.

Reference is made to FIG. 4B which illustrates an enlarged cross section taken along a line 4B—4B in FIG. 4A. The field oxide film 22a is formed on the Si substrate 21, and the bird's beaks 22b having the width of about 0.3 μm is extended into the semiconductor element region 30. The channel stopper 26a, which is formed in the Si substrate and is in contact with bottom surfaces of the $SiO_2$ films 22a and 22b, is extended about 0.2 μm in width beyond the edge of the bird's beak 22b into the semiconductor element region 30. Between the opposite edges of the bird's beaks 22b, there is formed a gate oxide film 32 on the Si substrate 21, and a word line WL is formed on the gate oxide film 32.

As apparent from FIGS. 4A and 4B, if the semiconductor element region 30 has a width of 1 μm or more, the semiconductor element region is not completely covered with the bird's beak 22b, and the channel stopper 26a does not extend into the entire area of the semiconductor element region 30. That is, if the semiconductor element region 30 has the width of 1 μm or more, there remains a region or area for forming a FET inside the channel stopper 26a and the bird's beak 22a extending inwardly from the periphery of the semiconductor element region 30.

However, if the width of the semiconductor region 30 becomes as small as 1 μm, the effective region for forming the FET is narrowed, which reduces a current value of the FET and increases a contact resistance of the contact hole 31 resulting in deterioration of the performance of the semiconductor IC. Particularly, in a small FET having a channel less that 1 μm, a so-called short-channel effect in which a threshold voltage fluctuates, is caused due to intrusion of the channel stopper 26a into the source/drain regions.

Further, in the semiconductor element region 30 having the width less than 1 μm, the channel stopper 26 extends throughout the semiconductor element region 30, which makes the formation of the FET difficult. Moreover, if the width of the semiconductor element region 30 is reduced to be less than 0.6 μm, the semiconductor element region 30 is entirely covered with the bird's beak 22b, which makes the formation of the FET impossible.

Referring to FIG. 5, there is illustrated simultaneous formation of a channel stopper layer and a punch-through prevention layer by ion implantation through a field oxide film pattern according to the prior art. For example, boron ions 35 are implanted with an acceleration energy of 200 keV through a field oxide film pattern 22a, 22b having a thickness of 5000 Å. As a result, a channel stopper layer 36a and a punch-through prevention layer 36b are formed simultaneously.

However, the field oxide film pattern includes bird's beak 22b, the thickness of which decreases gradually, and thus a transition impurity layer 36C is formed between the channel stopper layer 36a and the punch-through prevention layer 36b. During a heat treatment at a later stage, the transition impurity layer 36C is liable to spread undesirably by diffusion into the semiconductor device region neighboring the field oxide film 22a, 22b.

SUMMARY OF THE INVENTION

Accordingly, it is an object of the invention to provide a separation region by which the degree of integration can be increased without deteriorating performance of the semiconductor IC, and to provide a manufacturing method of the same.

A semiconductor device according to one aspect of the invention comprises a semiconductor substrate having a main surface, an isolating insulator film formed on the main surface and having a substantially vertical side wall, a plurality of semiconductor element regions, which are separated from each other by the isolating insulator film, for forming semiconductor circuit elements therein, a first impurity region formed in the substrate through a predetermined depth from an interface between the isolating insulator film and the substrate by ion implantation, second impurity regions formed in the element regions simultaneously with the first impurity region by the ion implantation and located at a predetermined depth from said main surface, and a side wall insulator film formed by means of anisotropic etching on the vertical wall of the isolating insulator film.

A manufacturing method of a semiconductor device according to another aspect of the invention comprises the steps of forming a first insulator film on a main surface of a semiconductor substrate, patterning the first insulator film to form an isolating insulator film having a substantially vertical side wall, effecting ion implantation for forming in the substrate a first impurity region to a predetermined depth from a boundary between the isolating insulator film and the substrate and for forming second impurity regions located at a predetermined depth from said main surface in a plurality of semiconductor element regions, which are separated by an isolating insulator film and are used for forming semiconductor circuit elements therein, forming a second insulator film to cover the isolating insulator film and said main surface, and effecting anisotropic etching on the second insulator film to leave a side wall insulator film on the vertical side wall of the isolating insulator film.

According to the invention, since the isolating insulator film having the substantially vertical side wall is formed by means of photolithography, the semiconductor element regions are precisely determined. Further, since the ion implantation through the isolating insulator film forms the first impurity region serving as a channel stopper, the second impurity regions serving as a so-called punch-though prevention layer can be formed simultaneously. Moreover, since the side wall insulator film can be formed by the anisotropic etching to have a width of about 0.1 μm or less, the width of the semiconductor element region can be reduced. Since the impurity layer such as source/drain of a FET is formed by the ion implantation, using not only the isolating insulator film but also the side wall insulator film as the mask, there is no overlapping of the source/drain region and the channel stopper. Accordingly, the channel stopper does not deteriorate the characteristics of the FET.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS

FIGS. 1A–1F are cross sections illustrating processes for forming an isolating region according to an embodiment of the invention.

Figure 1A:
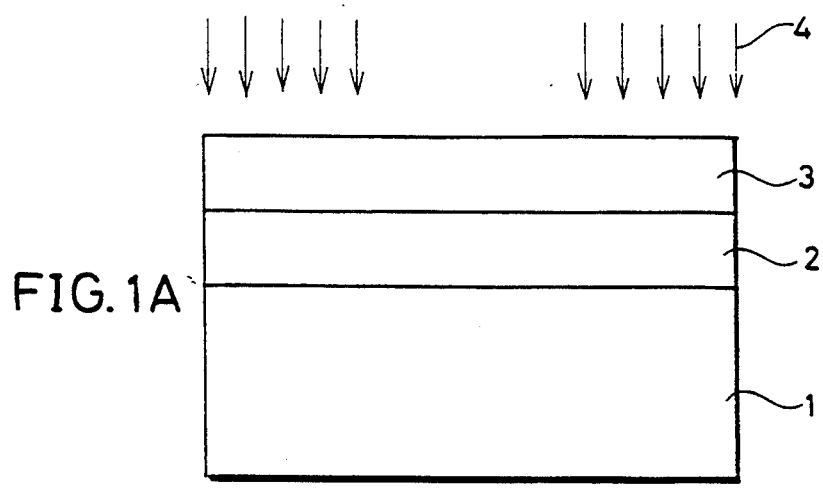
FIGS. 1A–1F are cross sections illustrating processes for forming an isolating region according to an embodiment of the invention.

Referring to FIG. 1A, a first insulator (e.g., SiO$_2$) film 2 having a thickness of about 4000 Å is deposited, for instance, by CVD on a semiconductor (e.g., silicon) substrate 1 of a p$^-$ conductive type. A photo resist layer 3 is applied on the first insulator film 2. The photo resist layer 3 is exposed by light 4 passing through a photomask.

Figure 1B:
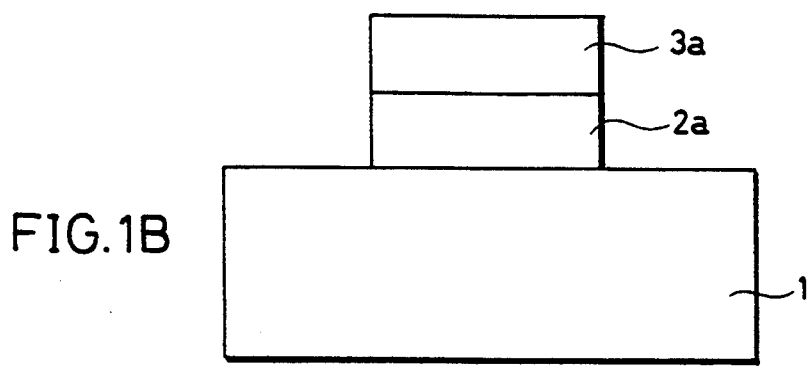

Referring to FIG. 1B, a resist pattern 3a is formed by development of the photo resist layer 3. The resist pattern 3a is used as a mask to effect anisotropic etching on the first insulator film 2, whereby an isolating insulator film 2a having a substantially vertical wall is formed.

Figure 1C:
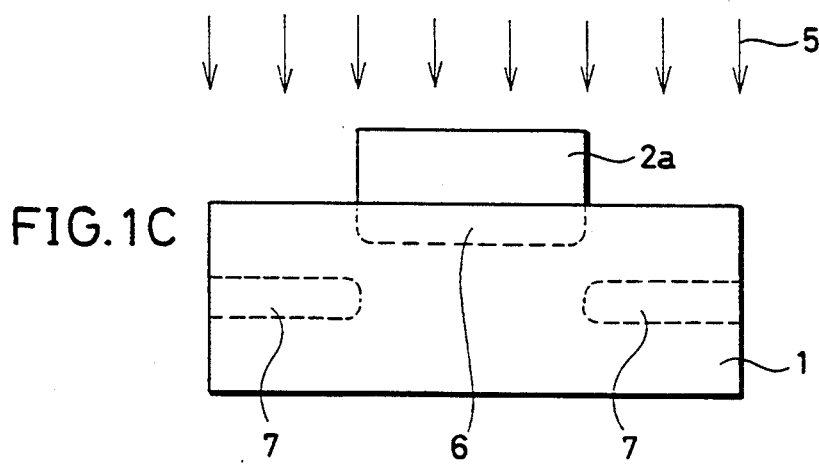

Referring to FIG. 1C, boron ions 5 for example are implanted at a dose rate in the range of $1\times10^{13}$–$1\times10^{14}$ depending on the width of the insulating insulator film 2a etc. and preferably of $1\times10^{14}$cm$^{-2}$ with an acceleration energy in the range of 110–210 keV and preferably 160 keV. If the acceleration energy is too low, the ions can not penetrate the isolating insulator film 2a. On the other hand, if the acceleration energy is too high, the impurity concentration cannot become high just beneath the isolating insulator film 2a. Incidentally, aluminum ions and gallium ions may also be used instead of boron ions. As a result of the ion implantation, a first impurity region 6, which has a thickness of about 2000 Å and will serve as a channel stopper under the isolating insulator film 2a, is formed, and a second impurity regions 7, which are separated from each other by the isolating insulator film 2a and have a thickness of about 2000 Å, are also formed at a depth of about 4000 Å from the surface of semiconductor substrate 1. These second impurity regions 7 will serve to prevent punch-through of FETs formed at the semiconductor element regions in a subsequent process.

Figure 5:
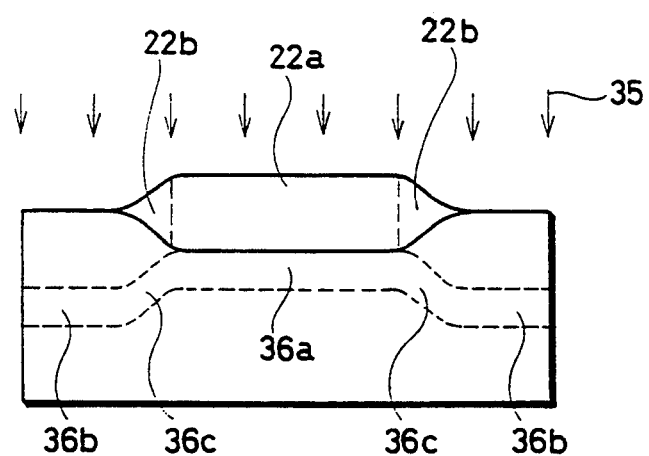
FIG. 5 is a cross section illustrating simultaneous formation of a channel stopper layer and a punch-through prevention layer by ion implantation according to the prior art.

In this case as seen in FIG. 1C, since the isolating insulator film 2a has the uniform thickness of about 4000 Å and vertical sidewalls, such an undesirable transition impurity layer as shown in FIG. 5 is not formed.

Figure 1D:
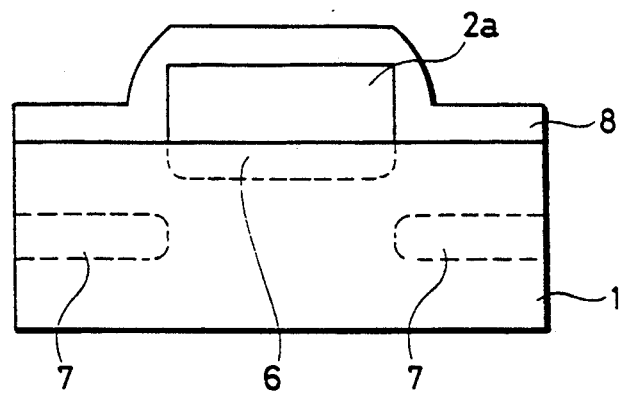

Referring to FIG. 1D, a second insulator (e.g., SiO$_2$) film 8 having a thickness ranging from 1000 Å to 2000 Å is deposited, for instance, by CVD to cover the surfaces of the separation insulator pattern 2a and the semiconductor substrate 1. This second insulator film 8 may be formed of material other than that of the separation insulator film 2a.

Figure 1E:
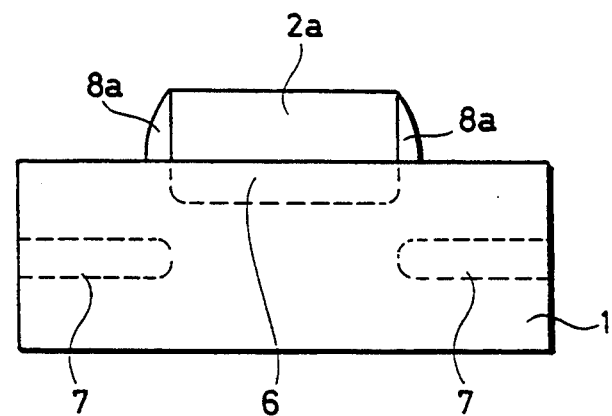

Referring to FIG. 1E, an anisotropic etching is effected on the second insulator film 8 from the above without using a mask. As a result, a side wall insulator film 8a is left on the vertical side wall of the isolating insulator film 2a. A width of the side wall insulator film 8a depends on the thickness of the second insulator film 8, and thus the side wall insulator film 8a having a small width of about 0.1 μm can be formed. Thus, the side wall insulator film 8a can be precisely formed in the width smaller than that of the conventional bird's beak.

Figure 1F:
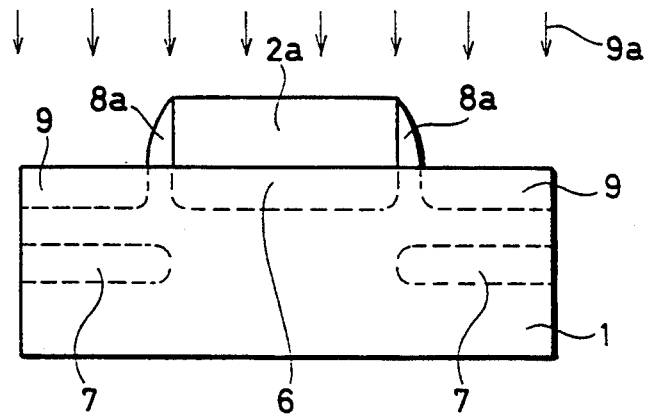

Referring to FIG. 1F, in order to form source/drain regions 9 of the FET, the isolating insulator film 2a and the side wall insulator film 8a are used as the mask, and, for example, arsenic ions 9a are implanted at the dose rate of $5\times10^{15}$cm$^{-2}$ with the energy of 50 keV. The source/drain regions 9 thus formed are separated from the channel stopper region 6 by a distance of about 0.1 μm which corresponds to the width of the side wall insulator film 8a.

Figure 3A:
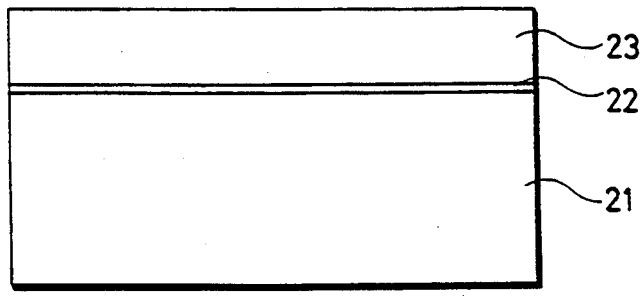
FIGS. 3A–3F are schematic cross sections illustrating formation processes of a field oxide film in the prior art.
Figure 3B:
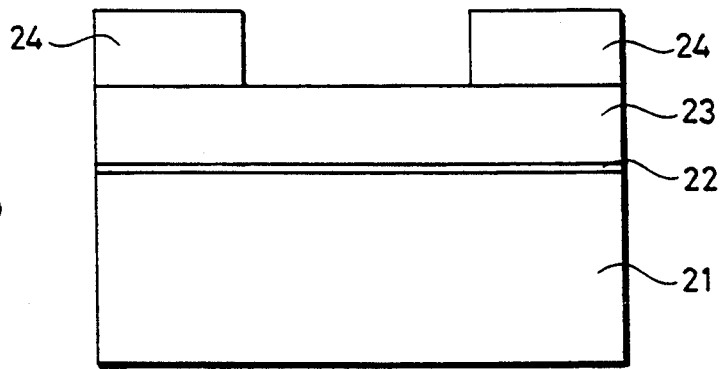
Figure 3C:
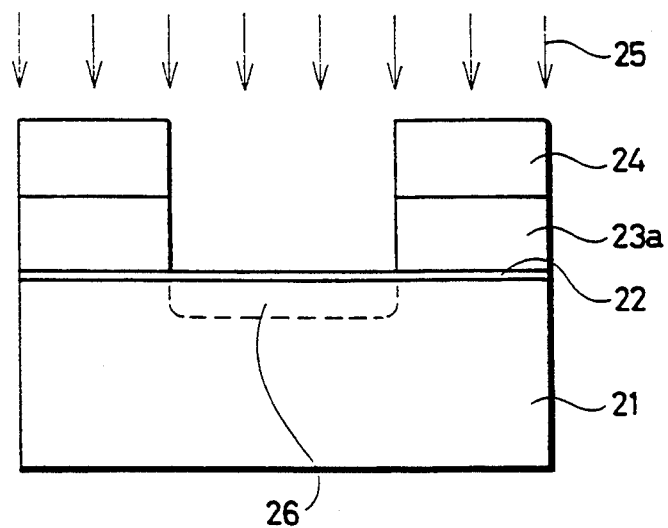
Figure 3D:
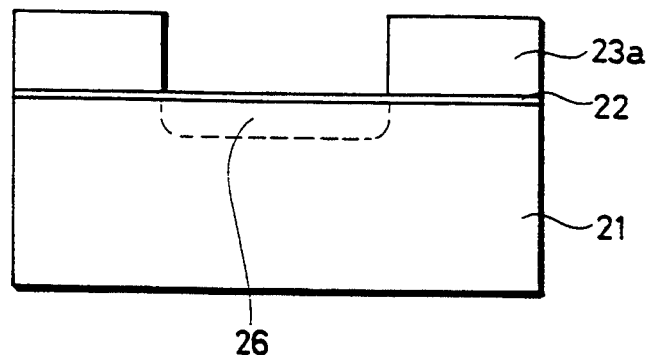
Figure 3E:
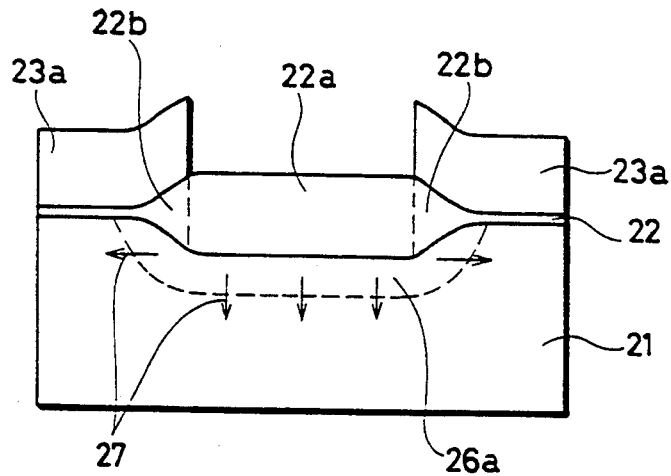
Figure 3F:
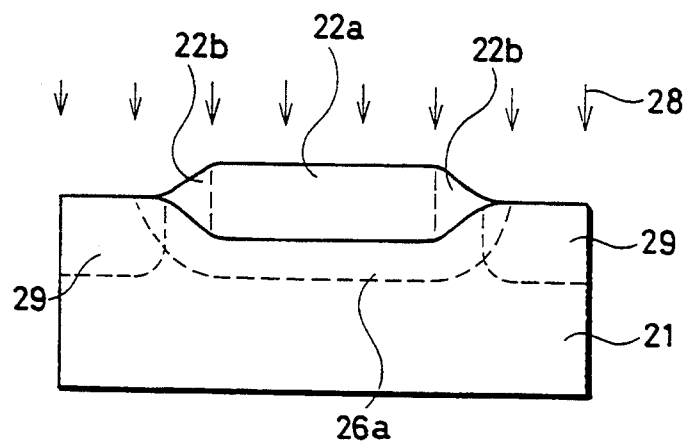
Figure 4A:
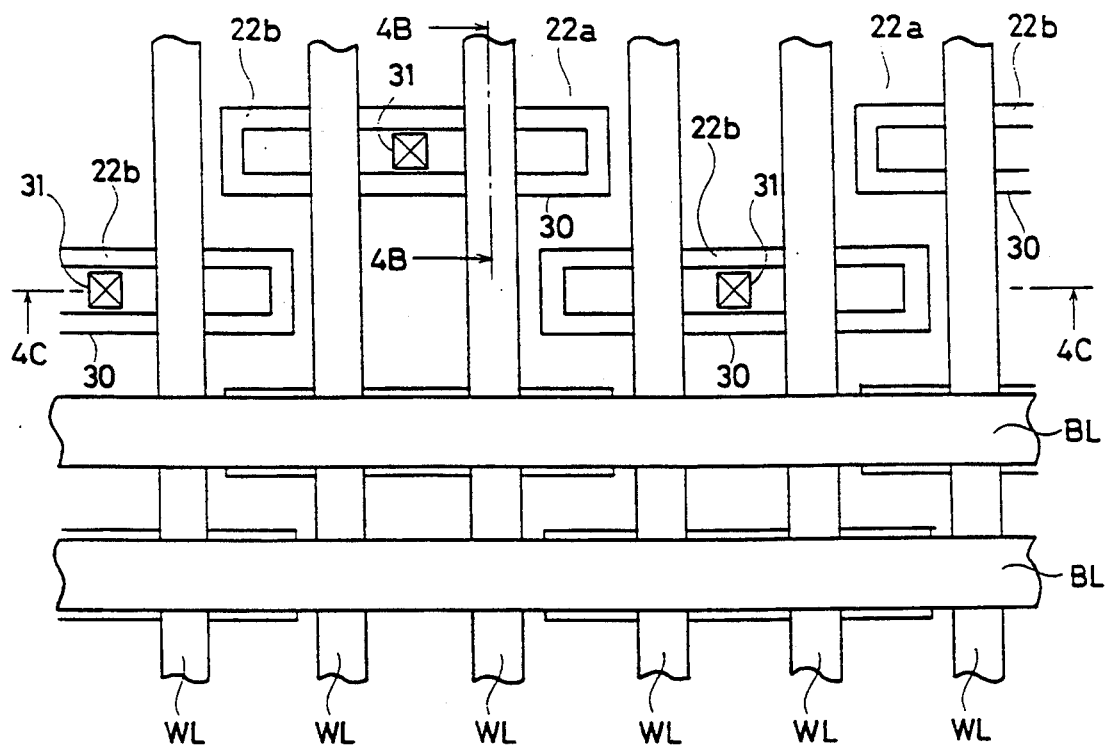
FIG. 4A is a schematic top view illustrating a memory cell array including a field oxide film in the prior art.
Figure 4B:
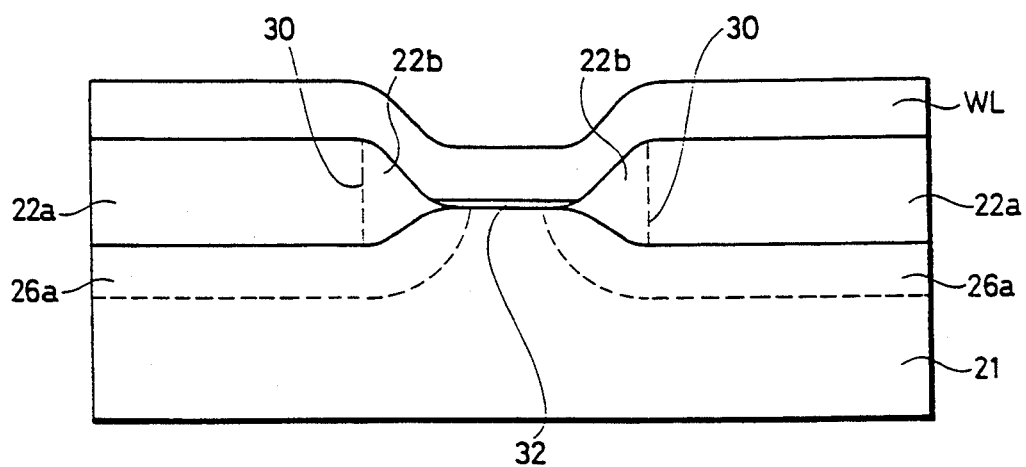
FIG. 4B is an enlarged cross section taken along a line 4B—4B in FIG. 4A.
Figure 4C:
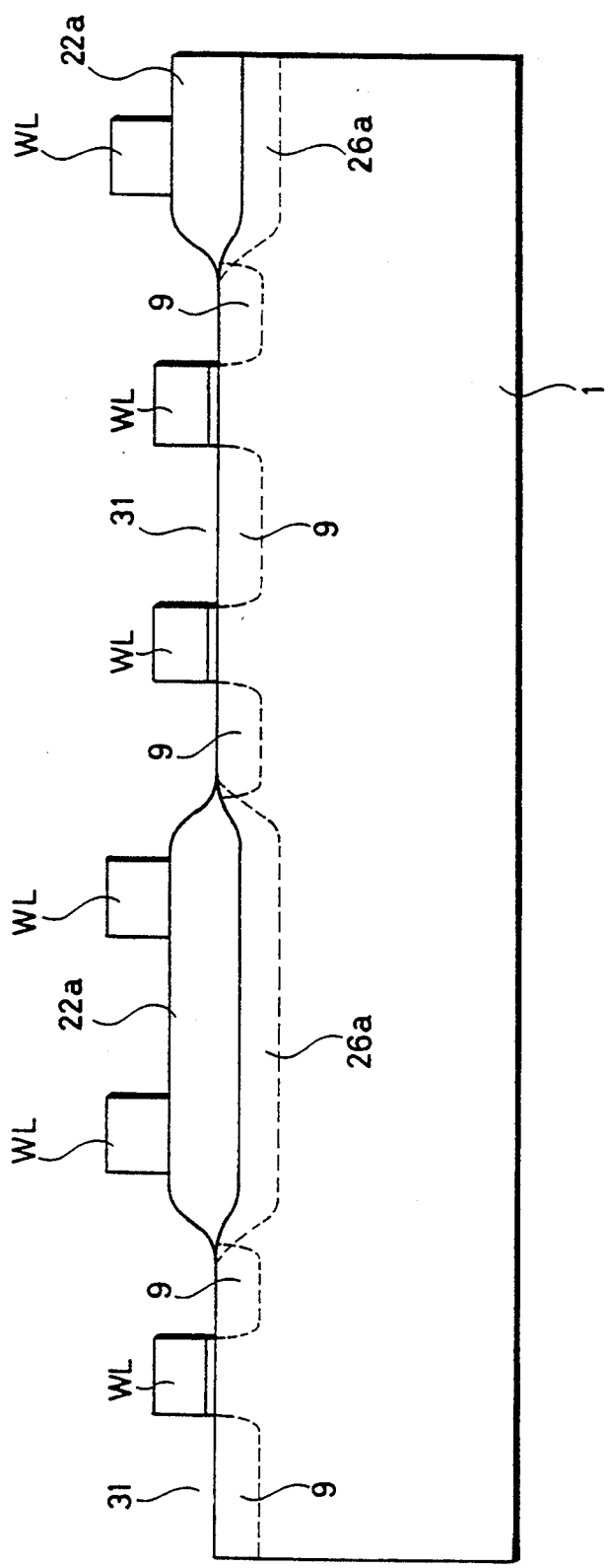
FIG. 4C is an enlarged cross section taken along a line 4C—4C in FIG. 4A.

Thus, the FET is not adversely affected by intrusion of the channel stopper region 6 into the source/drain regions 9. Accordingly, the dose rate of ions in the channel stopper 6 may be increased to ten times of that in the prior art, as mentioned in relation to FIGS. 1C and 3F. It should be noted that the thickness of the source/drain regions 9 can be controlled by the acceleration energy of the ions, and is usually formed in a range from 1000 Å to 3000 Å.

Figure 2A:
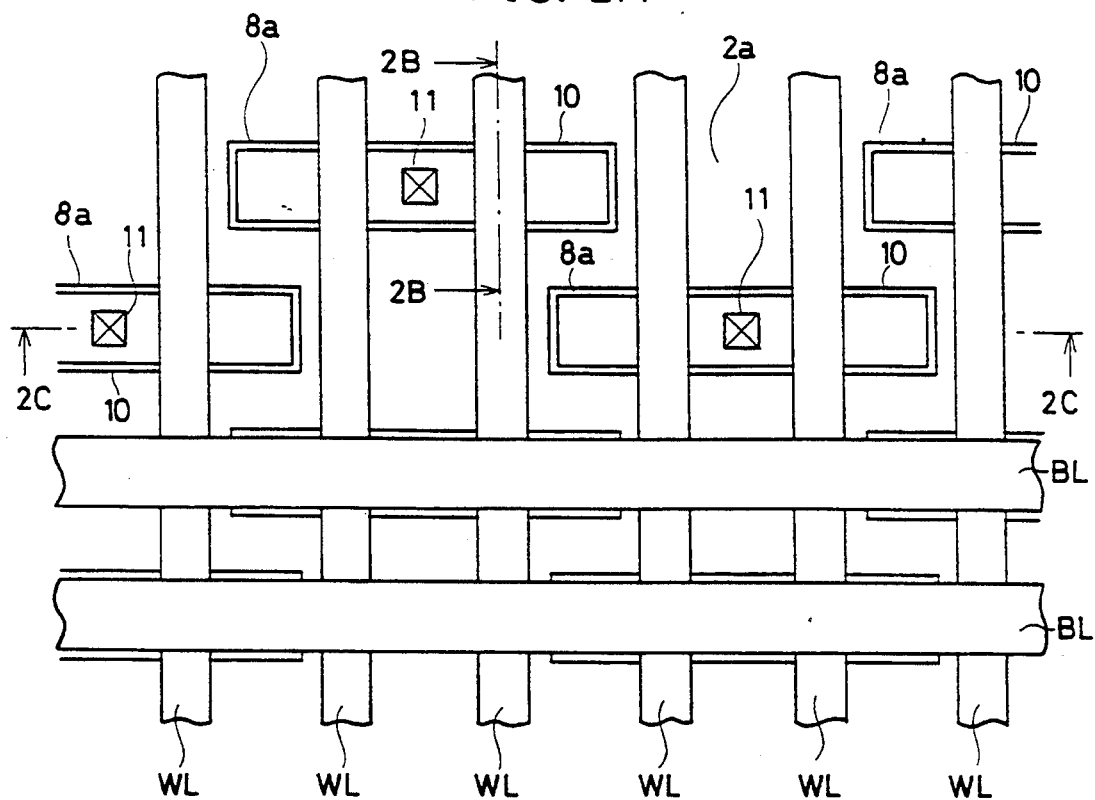
FIG. 2A is a schematic top view illustrating a memory cell array including an isolating region according to the invention.

Reference is then made to FIG. 2A, which is a schematic top view illustrating a memory cell array including an isolating region according to the invention. At an upper half in FIG. 2A, bit lines BL are not illustrated, for simplicity reasons. FIG. 2C shows an enlarged sectional view taken along a line 2C—2C in FIG. 2A.

As seen from FIGS. 2A and 2C, each elongated semiconductor circuit element region 10 is provided with three source/drain regions 9 aligned in a lengthwise direction thereof. The three source/drain regions 9 form a pair of FETs, and the middle source/drain region 9 is commonly used by these two FETs and is connected to the bit line BL through a contact hole 11. Each FET is selectively turned on and turned off by a corresponding word line WL.

The side wall insulator film 8a having the width of about 0.1 μm is formed along a periphery of each semiconductor element region 10 surrounded by the isolating insulator film 2a. The bird's beak 22b in the prior art has the large width of about 0.3–0.5 μm and accurate control of the width has been difficult. Conversely, the width of the side wall insulator film 8a can be controlled more accurately to form the side wall insulator film 8a having the width of 0.1 μm at most. Therefore, the effective width of the semiconductor element region 10 is reduced by the side wall insulator film 8a only to a slight extent.

Figure 2B:
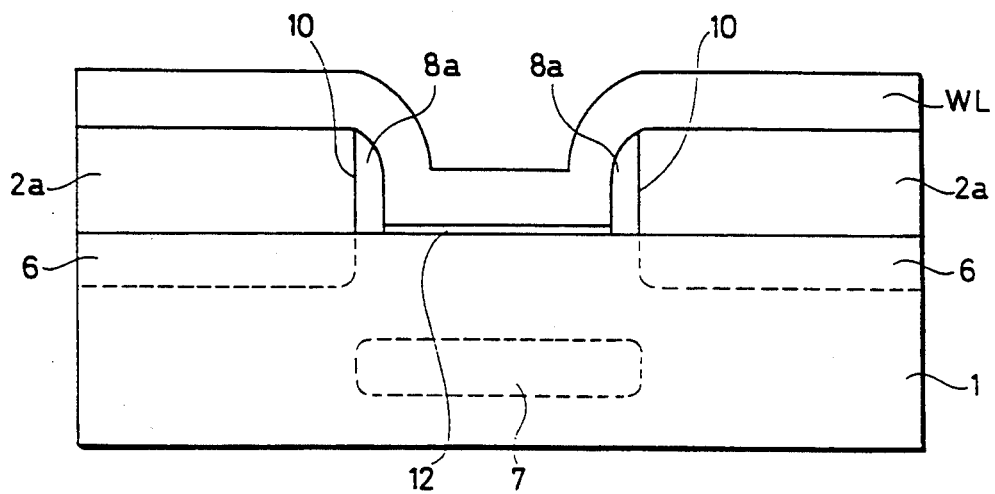
FIG. 2B is an enlarged cross section taken along a line 2B—2B in FIG. 2A.
Figure 2C:
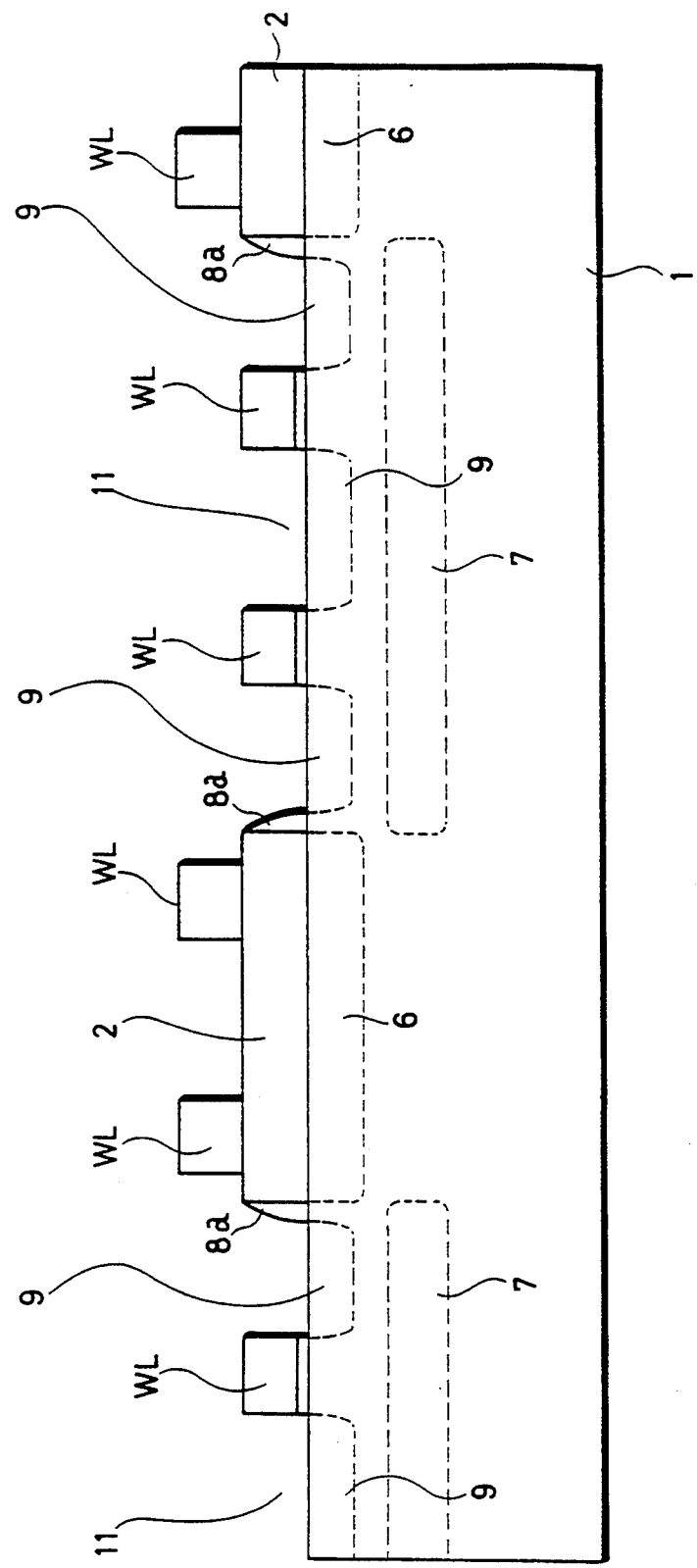
FIG. 2C is an enlarged cross section taken along a line 2C—2C in FIG. 2A.

Reference is made to FIG. 2B, which is an enlarged cross section taken along a line 2B—2B in FIG. 2A, an isolating insulator film 2a is formed on the semiconductor substrate 1, and the channel stopper 6 is formed immediately below the isolating insulator film 2a. The vertical side wall of the isolating insulator film 2a, which has been accurately patterned by the photolithography, using the anisotropic etching, determines the semiconductor element region 10, in which the impurity region 7 for preventing the punch-through is formed. On the vertical side wall of the isolating insulator film 2a formed is the side wall insulator film 8a in the thickness of about 0.1 μm. Between the opposed portions of the side wall insulator films 8a, a gate insulator film 12 is formed on the surface of the semiconductor substrate 1, and a word line WL is formed on the gate insulator film 12.

Although the first insulator film 2 of about 4000 Å thickness is deposited by CVD in the above-described embodiment, it may also be formed by thermal oxidation. When the silicon substrate is oxidized to form an oxide film, the volume of the oxide film becomes much larger than that of the consumed silicon. In the prior art, therefore, stress concentration is caused near the interface between the silicon substrate and the oxide film formed by LOCOS, particularly near the birds's beak. In the present invention, on the other hand, the thermal oxide film is formed on the entire surface of the silicon substrate, and thus the stress concentration between the oxide film and the silicon substrate is much less as compared with that near the bird's beak.

According to the invention, as described hereinabove, since the isolating insulator film having the substantially vertical side wall is formed by means of the photolithography, the semiconductor element region can be determined precisely. Further, since the first impurity region serving as the channel stopper is formed by the ion implantation passing through the isolating insulator film, the second impurity region serving as the punch-though prevention layer can be formed simultaneously with no transition impurity layer being formed therebetween. Since the side wall insulator film can be accurately formed to have the width less than about 0.1 μm by the anisotropic etching, the width of the semiconductor element region can be reduced. Moreover, since the impurity layer such as the source/drain of the FET is formed by the ion implantation, using not only the isolating insulator film but also the side wall insulator film as the mask, there is no overlapping of the source/drain region and the channel stopper. Accordingly, the channel stopper does not deteriorate the characteristics of the FET.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A manufacturing method of a semiconductor device comprising the steps of:
   forming a first insulator film on a main surface of a semiconductor substrate;
   patterning said first insulator film to form an isolating insulator film having a substantially vertical side wall;
   effecting ion implantation for forming in said substrate a first impurity region to a predetermined depth from an interface between said isolating insulator film and said substrate and for forming second impurity regions located at a predetermined depth from said main surface in a plurality of semiconductor element regions separated from each other by said isolating insulator film and used for forming semiconductor circuit element therein, said second impurity regions being located so as to prevent punch-through of said semiconductor circuit elements;
   forming a second insulator film to cover said isolating insulator film and said main surface; and
   effecting anisotropic etching on said second insulator film to leave a sidewall insulator film on said vertical side wall of said isolating insulator film.

2. A method according to claim 1, wherein said method further comprises the step of effecting ion implantation to form a third impurity region at a location shallower than said second impurity region in said substrate using said sidewall insulator film as a mask.

3. A method according to claim 2, wherein said third impurity region is separated from said first impurity region.

4. A method according to claim 1, wherein said first impurity region serves as a channel stopper.

5. A method according to claim 1, wherein said second impurity region serves to prevent punch-through FETs formed in said element regions.

6. A method according to claim 2, wherein said third impurity region serves as source/drain regions of FETs.

7. A manufacturing method of a semiconductor device comprising steps of:
   forming a first insulator film on a main surface of a semiconductor substrate;
   patterning said first insulator film to form an isolating insulator film having a substantially vertical sidewall; and
   during a common implantation to the substrate through the insulator film and to the substrate outside the insulator film, forming in said substrate a first impurity region to a first predetermined depth from an interface between said isolating insulator film and said substrate and forming second impurity regions located at a second predetermined depth from said main surface in a plurality of semiconductor element regions separated by said isolating insulator film and used for forming semiconductor circuit elements therein, said second impurity regions being located so as to prevent punch-through of said semiconductor circuit elements.

8. The method of claim 7, wherein said first insulator film is deposited by CVD.

9. The method of claim 7, wherein said first insulator film is formed by oxidizing the entire main surface of said substrate.

10. The method of claim 7, including
    forming a second insulator film to cover said isolating insulator film and said main surface,
    effecting anisotropic etching on said second insulator film to leave a sidewall insulator film on said vertical sidewall of said isolating insulator film, and
    implanting ions to form source/drain regions in said substrate at a depth less than said second predetermined depth using said sidewall insulator film as a mask.

11. The method of claim 1, wherein said third impurity region is formed so as to be separated from said first impurity region by a distance corresponding to a width of said sidewall insulator film in a direction parallel to said main surface of said substrate.

12. The method of claim 1, wherein said second impurity regions are formed beneath channel regions of the semiconductor circuit elements.

13. The method of claim 1, wherein each of said second impurity regions is formed so as to have a portion beneath and overlapping with said sidewall insulator film.

14. The method of claim 1, wherein said step of effecting ion implantation comprises the step of selecting a dose rate and an acceleration energy so as to provide the first impurity region serving as a channel stopper and to provide the second impurity region for preventing punch-through.

15. The method of claim 1, wherein said sidewall insulator film is formed so as to cover a word line of the semiconductor device.

16. The method of claim 7, wherein said step of common implantation comprises the step of selecting a dose rate and an acceleration energy so as to provide the first impurity region serving as a channel stopper and to provide the second impurity region for preventing punch-through.

17. The method of claim 7, wherein said second impurity regions are formed beneath channel regions of the semiconductor circuit elements.

18. The method of claim 10, wherein each of said second impurity regions is formed so as to have a portion beneath and overlapping with said sidewall insulator film.

19. The method of claim 10, wherein said source/drain regions are separated from said first impurity region by a distance corresponding to the width of said sidewall insulator film in a direction parallel to the main surface of said substrate.

20. The method of claim 10, wherein said sidewall insulator film is formed so as to cover a word line of the semiconductor device.

* * * * *